United States Patent [19]

Matsui et al.

[11] Patent Number: 4,815,040

[45] Date of Patent: Mar. 21, 1989

[54] STATIC MEMORY USING A MIS FIELD EFFECT TRANSISTOR

[75] Inventors: Masataka Matsui; Takayuki Ohtani, both of Tokyo, Japan

[73] Assignee: Kabushiki Kaisha Toshiba, Kawasaki, Japan

[21] Appl. No.: 100,640

[22] Filed: Sep. 24, 1987

[30] Foreign Application Priority Data

Sep. 29, 1986 [JP] Japan ................... 61-230661

[51] Int. Cl.$^4$ ............................................. G11C 7/00
[52] U.S. Cl. ................................... 365/203; 365/154; 365/208
[58] Field of Search ............... 365/189, 203, 205, 208, 365/154

[56] References Cited

U.S. PATENT DOCUMENTS

| 4,370,737 | 1/1983 | Chan | 365/205 |
|---|---|---|---|
| 4,539,494 | 9/1985 | Kurafuji | 365/208 |
| 4,658,382 | 4/1987 | Tran et al. | 365/203 |

OTHER PUBLICATIONS

Minato et al., "A 20ns 64K CMOS SRAM," IEEE International Solid-State Circuits Conference, ISSCC Digest of Technical Papers, pp. 222–223, Feb. 23, 1984.

Primary Examiner—James W. Moffitt
Attorney, Agent, or Firm—Finnegan, Henderson, Farabow, Garrett, & Dunner

[57] ABSTRACT

In a selected column, a pull-up transistor pair is not selected but, instead, a transmission gate transistor pair is selected. In the read mode, the transmission gate transistor pair serves as pull-up loads between the bit line pair. However, the transmission gate transistor pair is kept off until the voltage across the bit line pair is decreased from the power supply potential level to the threshold voltage level of the transmission gate transistors. Therefore, no DC current path is formed in the bit line pair when the voltage across the bit line pair is within a range from a voltage equal to the power supply potential level to a potential lower than the power supply potential by an amount equal to the threshold voltage level, and the rate of increase of a potential difference across the bit line pair is determined by a pull-in current of the memory cell. Therefore, a high-speed sense operation can be realized. In the write mode, the transmission gate transistor pair serves a bit line pull-up function. Since no normally-ON bit line load transistor is arranged, no direct current path including the bit line pair is present, and hence, low power consumption can be achieved.

6 Claims, 6 Drawing Sheets

STATIC MEMORY USING A MIS FIELD EFFECT TRANSISTOR

BACKGROUND OF THE INVENTION

The present invention relates to a static memory using an insulating gate type field effect transistor (MIS FET).

Figure 1:
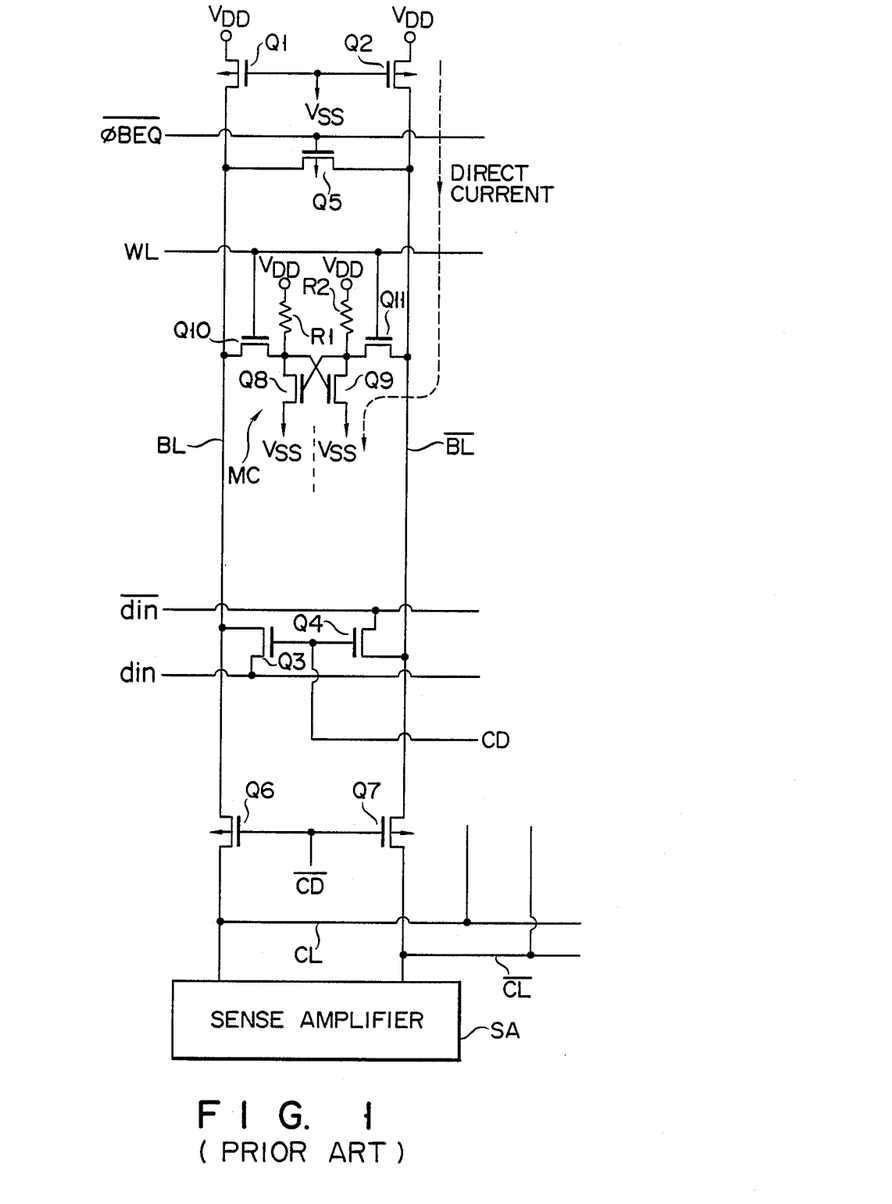
FIG. 1 is a diagram showing a circuit arrangement of a conventional static memory.

FIG. 1 shows an example of a bit line circuit section corresponding to each column of a memory cell array in a conventional static memory. A pair of bit lines BL and $\overline{BL}$ are connected to power supply terminal $V_{DD}$ through normally-ON p-channel pull-up load transistors Q1 and Q2. Bit lines BL and $\overline{BL}$ are also connected to a pair of write data lines din and $\overline{din}$ through n-channel transmission gate transistors Q3 and Q4 which are controlled to be selected by column selection signal CD. Bit lines BL and $\overline{BL}$ are connected to common data lines CL and $\overline{CL}$ through p-channel transmission gate transistors Q6 and Q7 which are controlled to be selected by inverted column selection signal $\overline{CD}$, and are also connected to sense amplifier SA. P-channel equalize transistor Q5, which is controlled to be selected by bit line equalize signal $\overline{\phi BEQ}$, is connected between bit lines BL and $\overline{BL}$. A plurality of static memory cells MC are parallel-connected between bit lines BL and $\overline{BL}$. Each memory cell MC comprises n-channel drive transistors Q8 and Q9 constituting a flip-flop circuit and their load resistors R1 and R2, and n-channel transmission gate transistors Q10 and Q11 connected between a pair of I/O terminals of the flip-flop circuit and bit lines BL and BL, as shown in FIG. 1. The gates of transistors Q10 and Q11 are connected to identical word line WL.

Figure 2:
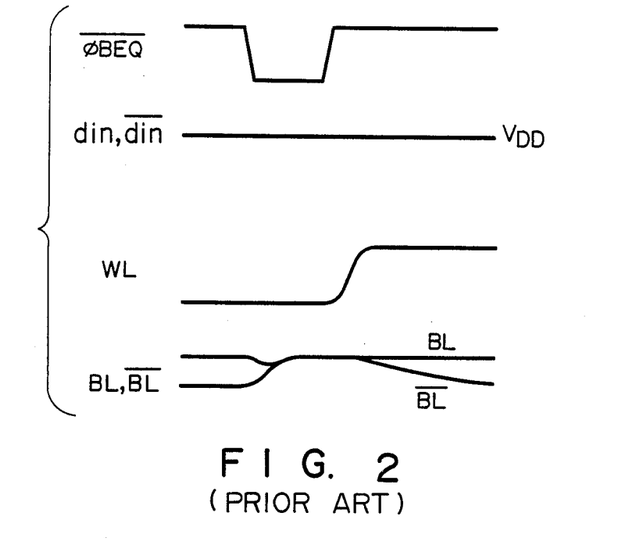
FIG. 2 is a timing chart showing signal waveforms of respective sections in the read mode of the conventional static memory shown in FIG. 1.

The read mode of the static memory cell with the above structure will now be described with reference to the timing chart shown in FIG. 2. Transistor Q5 is turned on in response to bit line equalize signal $\overline{\phi BEQ}$ which is generated before a word line selection operation is started in response to an internal clock signal generated based on a change in an external input signal such as an address input. When transistor Q5 is turned on, the potentials of the bit lines are pulled up to power supply voltage level $V_{DD}$ by pull-up load transistors Q1 and Q2 while being equalized.

When one of word lines WL is selected, low-potential (L-level) drive transistor Q9 and transmission gate transistor Q11, connected in series with transistor Q9 in memory cell MC connected to selected word line WL, are respectively turned on. When transistors Q9 and Q11 are turned on, the potential of L-level bit line $\overline{BL}$ is decreased to an intermediate potential between power supply potential VDD and ground potential $V_{SS}$.

In contrast to this, high-potential (H-level) bit line BL is left at the power supply potential, and potential difference $\Delta V$ is generated across the bit lines. Since transistors Q6 and Q7 of the selected column are turned on by inverted column selection signal $\overline{CD}$ before word line selection, potential difference $\Delta V$ across the bit lines is transmitted to common data lines CL and $\overline{CL}$ through transistors Q6 and Q7 and is input to sense amplifier SA to be differentially amplified in this selected column.

At this time, a direct current flows through a current path consisting of power supply terminal $V_{DD}$, L-level pull-up load transistor Q2, bit line $\overline{BL}$, transistor Q11 of memory cell MC, transistor Q9, and ground terminal $V_{SS}$. For this reason, a change rate of the potential of L-level bit line $\overline{BL}$ becomes low, since discharging by a pull-in current is cancelled by charging of the direct current. As a result, an increase in potential difference $\Delta V$ across the bit lines is disturbed, and its increase rate becomes low. Thus, the sense operation of the sense amplifier becomes slow.

In this case, pull-up load transistors Q1 and Q2 associated with the level of the direct current are provided to limit voltage amplitudes of bit lines BL and $\overline{BL}$ so that the above-mentioned pull-up/equalize operation of bit lines BL and $\overline{BL}$ is accelerated.

Therefore, in the conventional static memory cell, the sizes of pull-up load transistors Q1 and Q2 must be determined to optimize the speeds of the sense operation and the pull-up/equalize operation.

In the above read mode, transistors Q3 and Q4 are selected by column selection signal CD in the selected column. However, write data lines din and $\overline{din}$ are controlled to be kept at a voltage level equal to the power supply potential $V_{DD}$ in the read mode. Therefore, transistors Q3 and Q4 cannot be turned on until the bit line potentials are decreased from power supply potential $V_{DD}$ to the threshold voltages of transistors Q3 and Q4. For this reason, transistors Q3 and Q4 do not contribute to the sense operation. In a nonselected column, transistors Q3 and Q4 are kept off, and no sense operation is performed.

Figure 3:
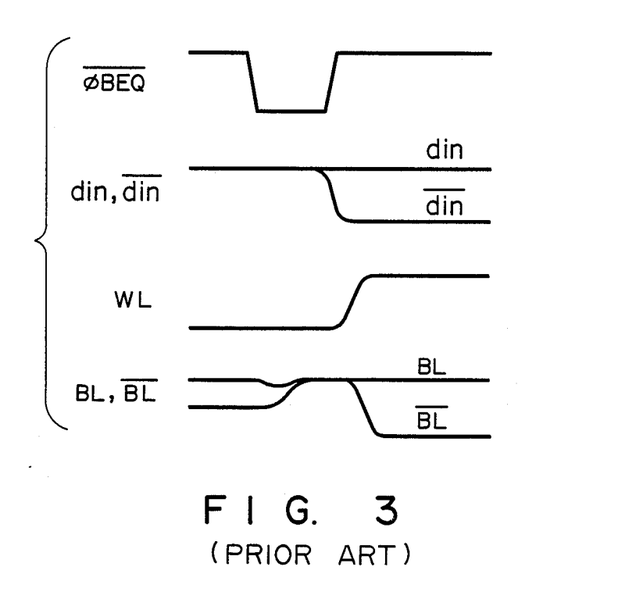
FIG. 3 is a timing chart showing signal waveforms of respective sections in the write mode of the conventional static memory shown in FIG. 1.

The write mode of the bit line circuit section will now be described with reference to the timing chart shown in FIG. 3. Column selection and word line selection are performed after the bit lines are equalized and pulled up in the same manner as in the read mode, and predetermined memory cell MC is selected. One (in this case, din) of write data lines din and $\overline{din}$ is kept at power supply potential $V_{DD}$ level and the other (in this case, $\overline{din}$) is pulled down to the ground potential. Thus, in the selected column, transistors Q3 and Q4 are turned on, so that bit lines BL and $\overline{BL}$ are respectively set at the power supply potential $V_{DD}$ level and the ground potential. In this manner, write control for memory cell MC is performed.

In a nonselected column, since transistors Q3, Q4, Q6, and Q7 are turned off, the potentials of bit lines BL and $\overline{BL}$ are changed in accordance with the data content of the memory cell selected by word line WL.

In the write mode as described above, the direct current flows through a path consisting of power supply potential $V_{DD}$, L-level pull-up load transistor Q2 in the selected column, bit line $\overline{BL}$, write control transistor Q4, and write data line $\overline{din}$. In this case, since the direct current is determined by the driving power of pull-up drive transistor Q2, it is increased several times that in the read mode, and causes an increase in power consumption in the write mode.

As described above, in the bit line circuit section of the conventional static memory shown in FIG. 1, a DC current flows through the bit lines of the selected column in a read cycle by the normally-ON type p-channel pull-up load transistor which is provided to limit the bit line amplitude. As a result, an increase rate of bit line potential difference $\Delta V$ becomes low, and the high-speed sense operation is disturbed. In the write cycle, a direct current several times that in the read mode flows through the bit lines of the selected column and this results in an increase in current consumption.

Figure 4:
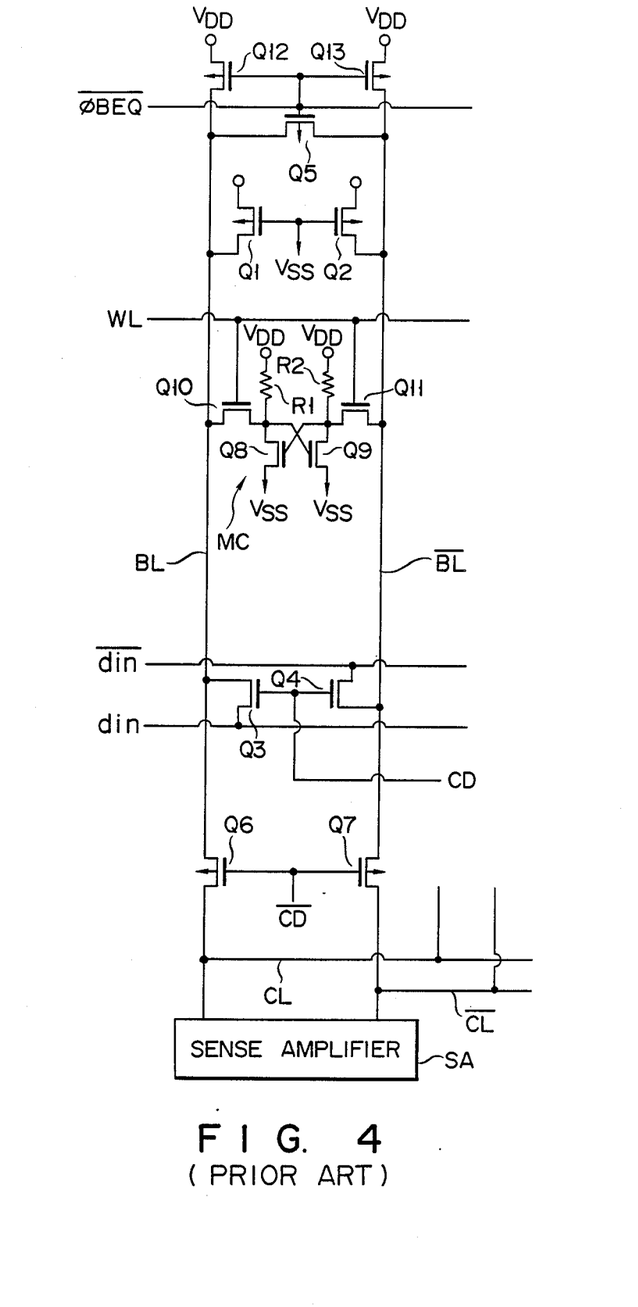
FIG. 4 is a diagram showing a circuit arrangement of another conventional static memory.

FIG. 4 shows a bit line circuit section in another conventional static memory. The same reference numerals in this figure denote the same parts as in FIG. 1, except that the bit line circuit section of this figure has p-channel precharge transistors Q12 and Q13 which are respectively connected in parallel with pull-up load transistors Q1 and Q2 and controlled to be selected by bit line precharge/equalize signal $\overline{\phi BEQ}$, and a bit-line precharge/equalize circuit is constituted by transistors Q12 and Q13 and equalize transistor Q5.

The basic operation of the bit line circuit section shown in FIG. 4 is substantially the same as that in FIG. 1. When precharge transistors Q12 and Q13 are turned on during the equalize operation, the current drive power of the load transistors in the column is enhanced. As a result, the precharge/equalize operation can be performed at higher speed than that in FIG. 1. Therefore, the circuit can be designed such that the current drive power of pull-up load transistors Q1 and Q2 is weakened by a degree corresponding to the current drive power of pull-up transistors Q12 and Q13. For this reason, a delay of an increase in potential difference across the bit lines in the read mode and an increase in power consumption due to the direct current in the selected column in the write mode can be slightly suppressed. However, the above problems cannot be satisfactorily solved.

It is an object of the present invention to provide a static memory capable of realizing a high-speed read operation, and of realizing low power consumption by removing a direct current component in a selected column in a write mode.

SUMMARY OF THE INVENTION

A static memory of the present invention comprises a memory cell provided between a pair of bit lines of each column in a memory cell array, a bit line precharge/equalize circuit arranged between the pair of bit lines and a power supply terminal and driven by a bit line precharge/equalize signal, a pair of column selection transistors arranged between the pair of bit lines and a sense amplifier and controlled to be selected by a column selection signal, a pair of transmission gate transistors arranged between the pair of bit lines and a pair of write data lines and controlled to be selected by the column selection signal, and a pair of bit line pull-up transistors arranged between the pair of bit lines and the power supply terminal and controlled to be in a nonselected state by the column selection signal.

In the selected column, the pull-up transistor pair is not selected but the transmission gate transistor pair is selected in the write mode. In the read mode, the transmission gate transistor pair serves as pull-up loads between the bit line pair. However, the transmission gate transistor pair is kept off until a voltage across the bit lines is decreased from the power supply potential to the threshold voltage of the transmission gate transistor pair.

Therefore, within a range varying from the power supply potential to a potential lower by the threshold voltage, no direct current path is present in the bit line pair, and an increase rate of the potential difference across the bit lines is determined by only a pulling current of the memory cell. Therefore, a high-speed sense operation can be performed.

In the selected column, the transmission gate transistor pair serves a function of pulling up the bit lines in the write mode. Since no normally-ON type bit line load transistor is used, no direct current path including the bit line pair is present, and low power consumption can be achieved.

In the nonselected column, since the transmission gate transistor pair is not selected but the pull-up transistor pair is selected, the voltage amplitudes of the bit line pair can be decreased to as low as the voltage amplitudes of the bit line pair in the read mode of the selected column, in both the read and write modes.

DETAILED DESCRIPTION OF THE PREFERRED EMBODIMENTS

An embodiment of the present invention will now be described with reference to the accompanying drawings.

Figure 5:
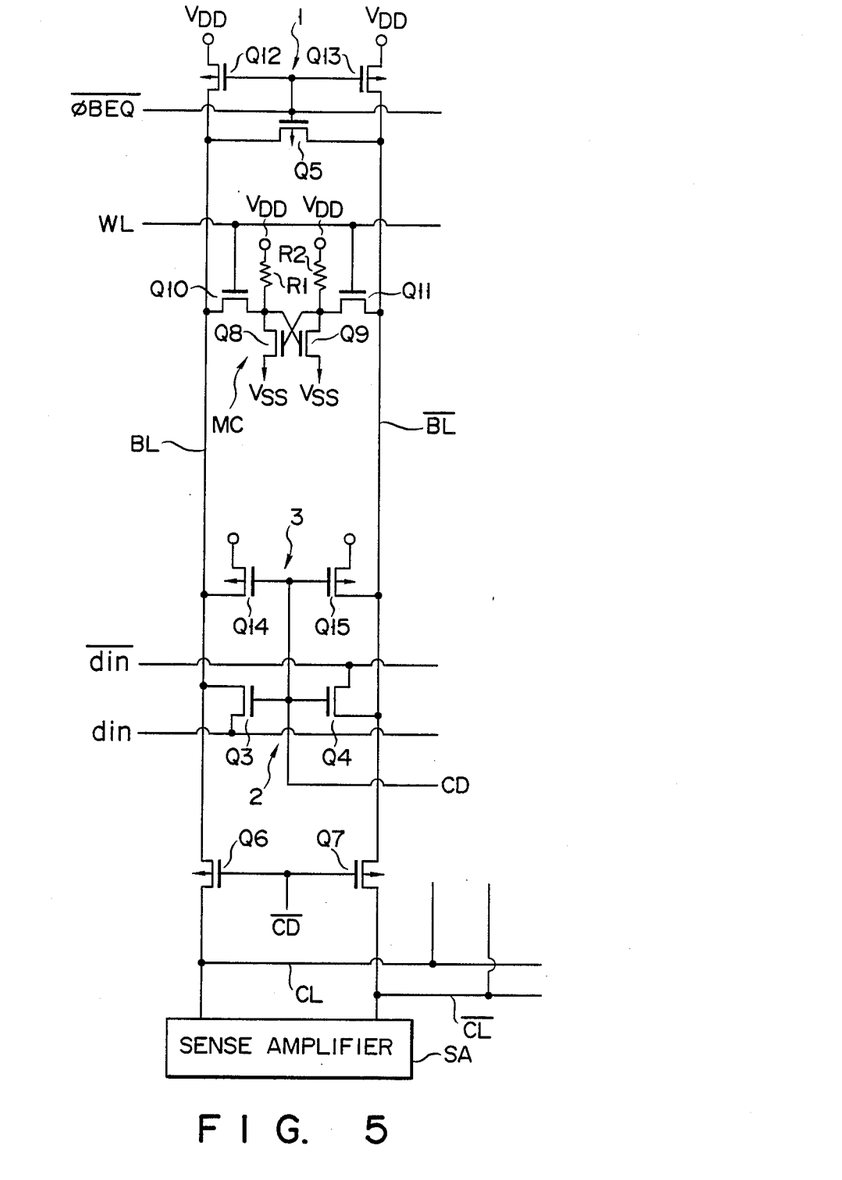
FIG. 5 is a view showing a circuit arrangement of a static memory according to the present invention.

FIG. 5 represents one column of a bit line circuit section corresponding to each column of a memory cell array in a static memory. Bit line precharge/equalize circuit 1 is constituted by p-channel pull-up transistor Q12, the source and drain of which are connected between power supply terminal $V_{DD}$ and bit line BL, p-channel pull-up transistor Q13, the source and drain of which are connected between power supply terminal VDD and bit line $\overline{BL}$, and p-channel equalize transistor Q5, the gate of which is connected to the gates of transistors Q12 and Q13 and the source and drain of which are connected to bit lines BL and $\overline{BL}$. P-channel pull-up transistors Q12 and Q13 are controlled to be selected by equalize/precharge signal $\overline{\phi BEQ}$.

The other end of each of bit lines BL and $\overline{BL}$ is connected to common data line CL or $\overline{CL}$ through p-channel column selection transistor Q6 or Q7. The other end of each of bit lines BL and $\overline{BL}$ is connected, through transistor Q6 or Q7, to differential sense amplifier SA which is commonly used for a plurality of columns.

Static memory cells MC are provided between bit lines BL and $\overline{BL}$. Each memory cell MC consists of n-channel drive transistors Q8 and Q9 constituting a flip-flop circuit, load resistors R1 and R2 for transistors Q8 and Q9, and n-channel transmission gate transistors Q10 and Q11 which are connected between a pair of I/O terminals of the flip-flop circuit and bit lines BL and $\overline{BL}$. The gates of transistors Q10 and Q11 are connected to identical word line WL.

N-channel transmission gate transistor Q3, which is controlled to be selected by column selection signal CD, is connected to bit line BL and write line din. N-channel transmission gate transistor Q4, which is controlled to be selected by column selection signal CD, is connected to bit line $\overline{BL}$ and write line $\overline{din}$. The gates of transistors Q3 and Q4 are connected to each other to constitute write control circuit 2.

P-channel bit line pull-up transistor Q14, which is controlled to be in a nonselected state by column selection signal CD, is provided between bit line BL and power supply terminal $V_{DD}$. P-channel bit line pull-up transistor Q15, which is controlled to be in a nonselected state by column selection signal CD, is provided between bit line $\overline{BL}$ and power supply terminal $V_{DD}$. Transistors Q14 and Q15 constitute bit line pull-up control circuit 3.

Therefore, no normally-ON type load is connected to bit lines BL and $\overline{BL}$. Bit line precharge/equalize circuit 1 which is turned on in synchronism with precharge/equalize signal $\phi BEQ$, write control circuit 2 which is turned on in synchronism with column selection signal CD, and bit line pull-up control circuit 3 which is turned on at the inactive level of column selection signal CD serve as loads.

Figure 6:
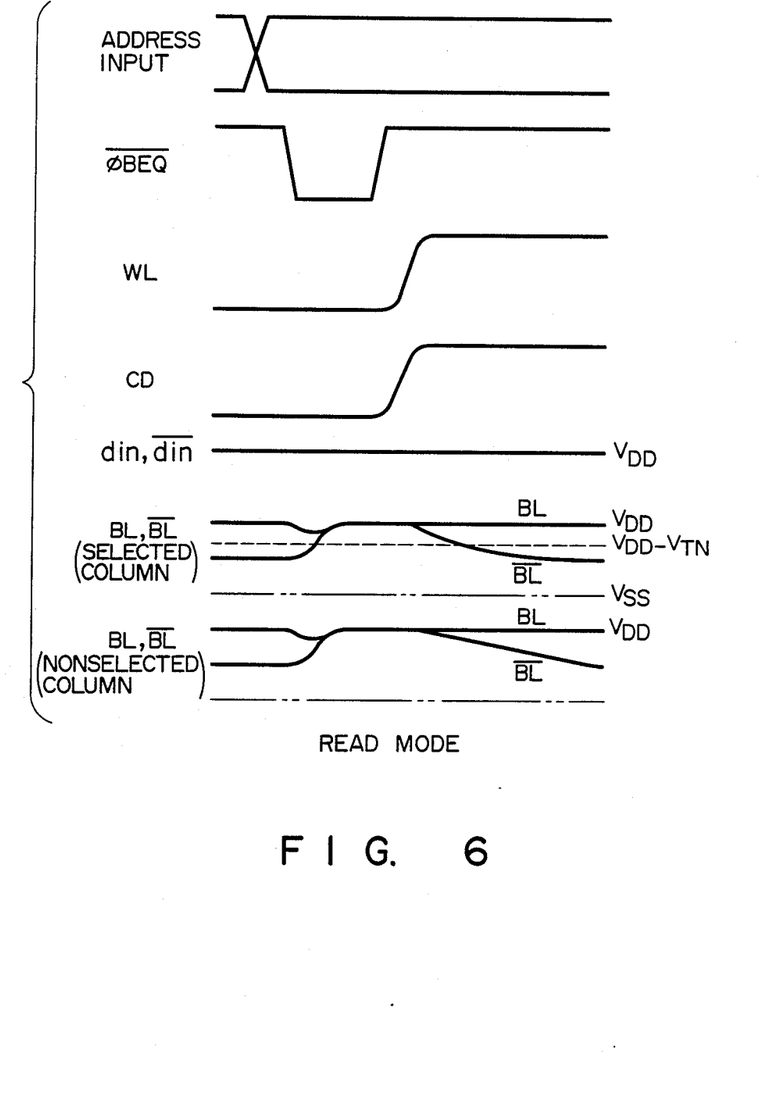
FIG. 6 is a timing chart showing signal waveforms of respective sections in the read mode of the static memory according to the present invention shown in FIG. 5.

The bit line drive operation in the read mode in the static memory of the present invention will now be described with reference to FIG. 6. In an address cycle starting after a change in address input, before selection of word line WL is started in each column, bit line precharge/equalize circuit 1 is operated in response to precharge/equalize signal $\phi BEQ$ to precharge/equalize bit lines BL and $\overline{BL}$. Thus, bit lines BL and $\overline{BL}$ are precharged to power supply potential $V_{DD}$.

When the column selection is performed, column selection transistors Q6 and Q7 of the selected column are turned on. As a result, bit lines BL and $\overline{BL}$ of the selected column are connected to common data lines CL and $\overline{CL}$. At this time, since transistors Q14 and Q15 of pull-up control circuit 3 are turned off, a column selection transistor pair consisting of p-channel column selection transistor Q6, the source and drain of which are connected to bit line BL, and p-channel column selection transistor Q7, the source and drain of which are connected to bit line $\overline{BL}$, is formed between sense amplifier SA and ON power supply terminal $V_{DD}$ in the read and write modes to be described later. Column selection transistors Q6 and Q7 constituting the column selection transistor pair are controlled to be selected by inverted signal $\overline{CD}$ of column selection signal CD. The drains of column selection transistors Q6 and Q7 are connected to a pair of common data lines CL and $\overline{CL}$.

During the precharge/equalize operation, transistors Q14 and Q15 of pull-up control circuit 3 are kept off. Therefore, in the read and write modes (to be described later), no ON bit-line pull-up load is present.

In contrast to this, in the nonselected column, since transistors Q14 and Q15 of pull-up control circuit 3 are turned on, they serve as bit line pull-up loads.

Thereafter, when one of a plurality of word lines is selected, transmission gate transistors Q10 and Q11 of selected memory cell MC are turned on, and data is output from the selected memory cell onto the pair of bit lines of each column. The potential of a bit line (in this embodiment, bit line $\overline{BL}$) connected to an L-level ON transistor (in this embodiment, transistor Q11) of transmission gate transistors Q10 and Q11 of the selected memory begins to fall due to the drive current of the drive transistor (Q9 in this embodiment) connected to transistor Q11.

At this time, since both write data lines din and $\overline{din}$ are controlled to be at power supply potential VDD, transmission gate transistors Q3 and Q4 of write control circuit 2 are turned on as pull-up loads. However, transistors Q3 and Q4 have no current drive power within a bit line potential region in which the potential falls from power supply potential $V_{DD}$ level to threshold voltage $V_{TN}$ level.

Therefore, in a bit line potential region in which the potential falls from power supply potential $V_{DD}$ level to threshold voltage $V_{TN}$ level of transistors Q3 and Q4, no DC current path from power supply potential $V_{DD}$ to ground potential $V_{SS}$ is formed, and the bit line charges are merely discharged by L-level transmission gate transistor Q11 and drive transistor Q9 of memory cell MC. A potential difference across the bit lines is increased faster than a conventional case wherein the normally-ON type bit line load transistor is present. If the potential difference $\Delta V$ across the bit lines reaches $\Delta V = V_{TN}$, it is sufficient as a potential difference necessary for detection by sense amplifier SA. Therefore, the sense operation is allowed. When the potential of L-level bit line $\overline{BL}$ is decreased below $V_{DD} - V_{TN}$, transistor Q4 of pull-up transistors Q3 and Q4 of write control circuit 2 begins to have a current drive power, and the potential of bit line $\overline{BL}$ is balanced at an intermediate potential between power supply potential $V_{DD}$ level and ground potential $V_{SS}$, which is determined by the drive power of transistor Q4, and of L-level transmission gate transistor Q11 and drive transistor Q9 of memory cell MC.

In contrast to this, the potential of the L-level bit line in the nonselected column is balanced at an intermediate potential determined by the drive powers of. ON pull-up transistor Q14 or Q15, and the L-level transmission gate transistor and the drive transistor of memory cell MC.

In this manner, in the read mode, the potential of the L-level bit line is controlled to be an intermediate potential by the n-channel transistor of write control circuit 2 in the selected column and by the p-channel transistor of pull-up control circuit 3 in the non-selected column, so that a time necessary for the bit-line precharge/equalize operation in the next read or write cycle can be shortened. In addition, an AC current flowing through the bit lines can be eliminated. Therefore, access time can be shortened, and low power consumption can be achieved.

Figure 7:
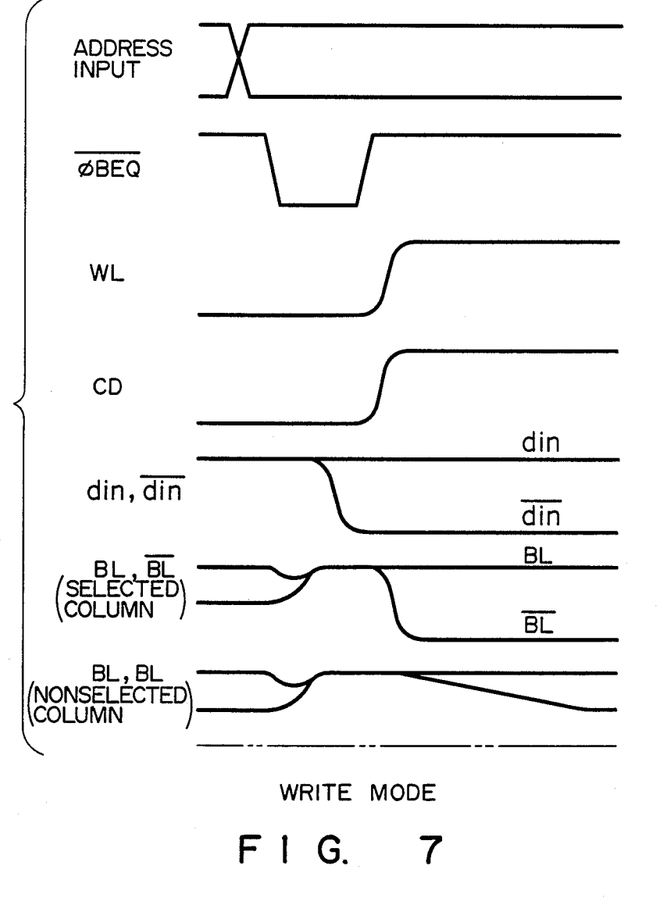
FIG. 7 is a timing chart showing signal waveforms of respective sections in the write mode of the static memory according to the present invention shown in FIG. 5.

FIG. 7 shows signal waveforms of respective sections in the write mode of the static memory according to the present invention. After an address input is changed, the operation from when the bit line precharge/equalize operation is started in response to precharge/equalize signal $\phi BEQ$ until the word line selection is performed is the same as that in the read mode as described above.

One of write data lines din and $\overline{din}$ (in this embodiment, data line din) is pulled up to power supply potential $V_{DD}$, and the other one of data lines din and $\overline{din}$ (in this embodiment, data line $\overline{din}$) is pulled down to ground potential $V_{SS}$ parallel to the memory selection. Thus, transmission gate transistors Q3 and Q4 of write control circuit 2 are turned on in the selected column, and the potentials of bit lines BL and $\overline{BL}$ are respectively set at power supply potential $V_{DD}$ level and ground potential $V_{SS}$, thereby performing data write access to memory cell MC.

In contrast to this, in the nonselected column, transmission gate transistors Q3 and Q4 of write control circuit 2 are turned off, and pull-up transistors Q14 and Q15 of pull-up control circuit 3 are turned on. Therefore, the potentials of bit lines BL and $\overline{BL}$ are balanced at the intermediate potential as in the read mode.

In this manner, in the write mode, no pull-up load is present at the bit line of the ground potential in the selected column, and no direct current is generated at all. Therefore, low power consumption in the write mode can be achieved.

In the nonselected column, a direct current component flows through the bit lines. However, the level of the direct current is as low as in the read mode.

As described above, the static memory of the present invention can attain a shorter read access time in the read mode and lower power consumption in the write mode as compared to those of the conventional static memory.

More specifically, in the read mode, a decrease in potential of the L-level bit line is determined by discharging of bit line charges due to a pull-in current of the memory cell in the selected column. Thus, high-speed bit line drive by a conventional normally-ON type bit line load transistor like in the conventional memory can be realized.

In the selected column, after the potential difference across the bit lines is increased to be sufficiently larger than the detection sensitivity of the sense amplifier, the L-level bit line is balanced at the intermediate potential by the pull-up load effect of the transistor in the write control circuit. In the nonselected column, the L-level bit line is balanced at the intermediate potential by the pull-up load effect of the transistor in the pull-up control circuit. In this manner, since the bit line potentials of all the columns are balanced at the intermediate potential regardless of the selected and nonselected columns, high-speed bit line precharge by the bit line precharge/equalize circuit can be realized in the read/write operation of the next cycle.

Since an increase in potential difference across bit lines is independent of the pull-in current of the memory cell as the pull-up load, a margin for a variation in memory cell drive current due to a variation in threshold voltage of the memory cell transistors, and hence, a margin for a variation in bit line drive time can be improved.

In the write mode, since no pull-up load is present at the bit line of the ground potential in the selected column, no large direct current component is generated unlike in the conventional memory, and low power consumption in the write mode can be achieved.

Furthermore, according to the present invention, a margin for electromigration of bit lines (normally, aluminum wirings) due to a direct current can be improved as compared to a conventional memory wherein a direct current several times that in the read mode flows in the write mode.

What is claimed is:

1. A static memory comprising:
   a memory cell provided to a pair of bit lines of each column in a memory cell array;
   a bit line precharge circuit arranged between said pair of bit lines and a power supply terminal and driven by a bit line precharge signal;
   a pair of column selection transistors arranged between said pair of bit lines and a sense amplifier and controlled to be selected by an inverted column selection signal;
   a pair of transmission gate transistors arranged between said pair of bit lines and a pair of write data lines and controlled to be selected by a column selection signal; and
   a pair of bit line pull-up transistors arranged between said pair of bit lines and said power supply terminal and controlled to be nonselected by the column selection signal.

2. A memory according to claim 1, wherein said memory cell comprises a pair of drive transistors constituting a flip-flop circuit, a load resistor connected to one of said pair of drive transistors and said power supply terminal, another load resistor connected to the other one of said pair of drive transistors and said power supply terminal, a transmission gate transistor connected to one of said pair of drive transistors and one of said pair of bit lines and having a gate connected to a word line, and another transmission gate transistor connected to the other one of said pair of drive transistors and the other one of said pair of bit lines and having a gate connected to said word line.

3. A memory according to claim 1, wherein said precharge circuit comprises an equalize transistor connected between said pair of bit lines, a pull-up transistor connected to said power supply terminal and one of said pair of bit lines, having a gate connected to the gate of said equalize transistor, and controlled to be selected by the precharge signal, and another pull-up transistor connected to said power supply terminal and the other one of said pair of bit lines, having a gate connected to the gate of said equalize transistor, and controlled to be selected by the precharge signal.

4. A memory according to claim 1, wherein said pair of column selection transistors comprise a column selection transistor connected to one input terminal of a differential sense amplifier and one of common data lines through one of said pair of bit lines and controlled to be selected by the inverted column selection signal, and another column selection transistor connected to the other one of said pair of bit lines and the other one of said pair of common data lines and controlled to be selected by the inverted column selection signal.

5. A memory according to claim 1, wherein said pair of transmission gate transistors comprise a transmission gate transistor connected between one of said pair of bit lines and one of said pair of data write lines and controlled to be selected by the column selection signal, and another transmission gate transistor connected between the other one of said pair of bit lines and the other one of said pair of data write lines and controlled to be selected by the column selection signal.

6. A memory according to claim 1, wherein said pair of bit line pull-up transistors comprise a bit line pull-up transistor connected between one of said pair of bit lines and said power supply terminal and controlled to be nonselected by the column selection signal, and another bit line pull-up transistor connected between the other one of said pair of bit lines and said power supply terminal and controlled to be nonselected by the column selection signal.

* * * * *